United States Patent
Lim et al.

(10) Patent No.: US 8,981,480 B2
(45) Date of Patent: Mar. 17, 2015

(54) SEMICONDUCTOR DEVICE HAVING LOW RESISTIVITY REGION UNDER ISOLATION LAYER

(75) Inventors: Jun-Hee Lim, Seocho-gu (KR); Satoru Yamada, Seoul (KR); Sung-Duk Hong, Gyeonggi-do (KR)

(73) Assignee: Samsung Electronics Co., Ltd., Suwon-Si, Gyeonggi-Do (KR)

(*) Notice: Subject to any disclaimer, the term of this patent is extended or adjusted under 35 U.S.C. 154(b) by 299 days.

(21) Appl. No.: 13/180,822

(22) Filed: Jul. 12, 2011

(65) Prior Publication Data

US 2012/0049256 A1 Mar. 1, 2012

(30) Foreign Application Priority Data

Aug. 27, 2010 (KR) .................. 10-2010-0083448

(51) Int. Cl.
| | |
|---|---|
| H01L 29/786 | (2006.01) |
| H01L 27/108 | (2006.01) |
| H01L 21/762 | (2006.01) |
| H01L 21/8234 | (2006.01) |

(52) U.S. Cl.
CPC .... *H01L 27/10894* (2013.01); *H01L 21/76264* (2013.01); *H01L 21/823481* (2013.01)
USPC .... 257/349; 257/371; 257/545; 257/E21.544; 257/E21.545; 438/220; 438/221; 438/248

(58) Field of Classification Search
USPC ......... 257/213, 218, 349, 371, 374, 545, 550, 257/E21.54, E21.544, E21.545; 438/196, 438/208, 218, 219, 220, 221, 248
See application file for complete search history.

(56) References Cited

U.S. PATENT DOCUMENTS

| | | | | |
|---|---|---|---|---|
| 5,648,281 | A | * | 7/1997 | Williams et al. ............... 438/358 |
| 2004/0224472 | A1 | * | 11/2004 | Hebert .......................... 438/306 |
| 2006/0220115 | A1 | * | 10/2006 | Otake ............................ 257/335 |
| 2007/0018264 | A1 | * | 1/2007 | Rhodes et al. ................ 257/432 |
| 2007/0080385 | A1 | | 4/2007 | Kim et al. |
| 2008/0274596 | A1 | * | 11/2008 | Matsumoto et al. .......... 438/154 |
| 2009/0127631 | A1 | * | 5/2009 | Rittaku ......................... 257/370 |
| 2010/0193869 | A1 | * | 8/2010 | Habasaki ...................... 257/360 |
| 2011/0168872 | A1 | * | 7/2011 | Kobayashi et al. ......... 250/208.1 |

FOREIGN PATENT DOCUMENTS

| | | |
|---|---|---|
| KR | 100675285 | 1/2007 |
| KR | 100741468 | 7/2007 |
| KR | 1020090099774 | 9/2009 |
| KR | 1020100001857 | 1/2010 |

* cited by examiner

*Primary Examiner* — Su C Kim
(74) *Attorney, Agent, or Firm* — F. Chau & Associates, LLC

(57) ABSTRACT

A semiconductor device includes a buried well, first and second active regions, an isolation layer, and a low resistance region. The buried well is disposed on a substrate and has impurity ions of a first conductivity type. The first and second active regions are disposed on the buried well and each have impurity ions of a second conductivity type, which is different from the first conductivity type. The isolation layer is disposed between the first and second active regions. The low resistance region is disposed between the isolation layer and the substrate and has impurity ions of the second conductivity type. The concentration of impurity ions in the low resistance region is greater than the concentration of the impurity ions in each of the first and second active regions.

22 Claims, 9 Drawing Sheets

SEMICONDUCTOR DEVICE HAVING LOW RESISTIVITY REGION UNDER ISOLATION LAYER

CROSS-REFERENCE TO RELATED APPLICATION

This application claims priority under 35 U.S.C. §119 to Korean Patent Application No. 10-2010-0083448 filed on Aug. 27, 2010, the disclosure of which is incorporated by reference herein in its entirety.

BACKGROUND

1. Technical Field

Exemplary embodiments of the inventive concept relate to a semiconductor device and a method of fabricating the same.

2. Discussion of the Related Art

In the field of semiconductor device manufacture, various processes are implemented to enhance electrical characteristics of the transistors. Reducing transistor resistance in semiconductor devices has been a continuing area of focus.

SUMMARY

According to an exemplary embodiment of the present inventive concept, a semiconductor device includes a buried well having impurity ions of a first conductivity type, a first active region and a second active region each having impurity ions of a second conductivity type, an isolation layer disposed between the first and second active regions, and a low resistance region disposed between the isolation layer and a substrate. The buried well is disposed on the substrate. The second conductivity type is different from the first conductivity type. The first and second active regions are disposed on the buried wall. The low resistance region has impurity ions of the second conductivity type, and a concentration of the impurity ions in the low resistance region is greater than a concentration of the impurity ions in each of the first and second active regions.

In an exemplary embodiment, an adhesive layer is disposed between the substrate and the buried well, and an interconnection layer is disposed between the adhesive layer and the buried well. The low resistance region extends into the buried well.

In an exemplary embodiment, the low resistance region makes contact with the first and second active regions.

In an exemplary embodiment, the buried well has a first thickness substantially equal to a distance between the first active region and the interconnection layer, and a second thickness substantially equal to a distance between a lower portion of the low resistance region and the interconnection layer. The second thickness is less than the first thickness.

In an exemplary embodiment, the low resistance region makes contact with the isolation layer.

In an exemplary embodiment, the interconnection layer includes a barrier layer and a metal layer. The metal layer is disposed between the barrier layer and the adhesive layer.

In an exemplary embodiment, the device includes a back bias line electrically connected to the low resistance region.

In an exemplary embodiment, a gate electrode is disposed on the first active region. A source region and a drain region are disposed in the first active region. The source region is adjacent to a first side of the gate electrode and the drain region is adjacent to a second side of the gate electrode. A back plug is connected to the back bias line.

In an exemplary embodiment, the back plug makes contact with the second active region.

In an exemplary embodiment, the back plug extends through the isolation layer and is connected to the low resistance region.

In an exemplary embodiment, an adhesive layer is disposed between the substrate and the buried well and an interconnection layer is disposed between the adhesive layer and the buried well. The low resistance region extends through the buried well and makes contact with the interconnection layer.

According to an exemplary embodiment of the present inventive concept, a semiconductor device includes a buried n-well disposed on a substrate having a peripheral region and a cell region, first and second active regions, an isolation layer, and a low resistance region. The first and second active regions each have p-type impurity ions and are disposed on the buried n-well. The isolation layer is disposed between the first and second active regions. The low resistance region is disposed between the isolation layer and the substrate. The low resistance region has p-type impurity ions, and a concentration of the p-type impurity ions in the low resistance region is greater than a concentration of the p-type impurity ions in each of the first and second active regions.

In an exemplary embodiment, the device includes an adhesive layer disposed on the substrate in each of the peripheral region and the cell region, and an interconnection layer disposed on the adhesive layer in the peripheral region.

In an exemplary embodiment, the device includes a cell transistor formed in the cell region of the substrate and a bit line disposed between the cell transistor and the adhesive layer.

In an exemplary embodiment, the bit line is the same material as the interconnection layer, and the bit line is disposed at substantially the same level as the interconnection layer.

In an exemplary embodiment, the cell transistor includes a first source region and a first drain region disposed on the bit line, an active pillar disposed on the first source and drain regions, a second source region and a second drain region disposed on the active pillar, and a word line formed on a sidewall of the active pillar.

In an exemplary embodiment, the first source and drain regions are the same material as the buried n-well, the first source and drain regions have substantially the same height as the buried n-well, and a top surface of the second source and drain regions has substantially the same height as a top surface of the first active region.

In an exemplary embodiment, a data storage element is connected to the second source and drain regions.

In an exemplary embodiment, the first active region, the second active region, and the low resistance region are each a single crystalline semiconductor layer formed of boron (B).

According to an exemplary embodiment of the present inventive concept, a method of fabricating a semiconductor device includes forming a buried well on a semiconductor substrate, forming a first active region and a second active region on the semiconductor substrate, forming a low resistance region under an isolation trench disposed between the first and second active regions, filling the isolation trench with an isolation layer, and electrically connecting a back bias line to the low resistance region. The buried well is formed by implanting impurity ions of a first conductivity type into the semiconductor substrate. The first and second active regions are formed using a mask pattern, and each region has impurity ions of a second conductivity type. The low resistance region is formed by implanting impurity ions of the second conductivity type.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION

Figure 1:
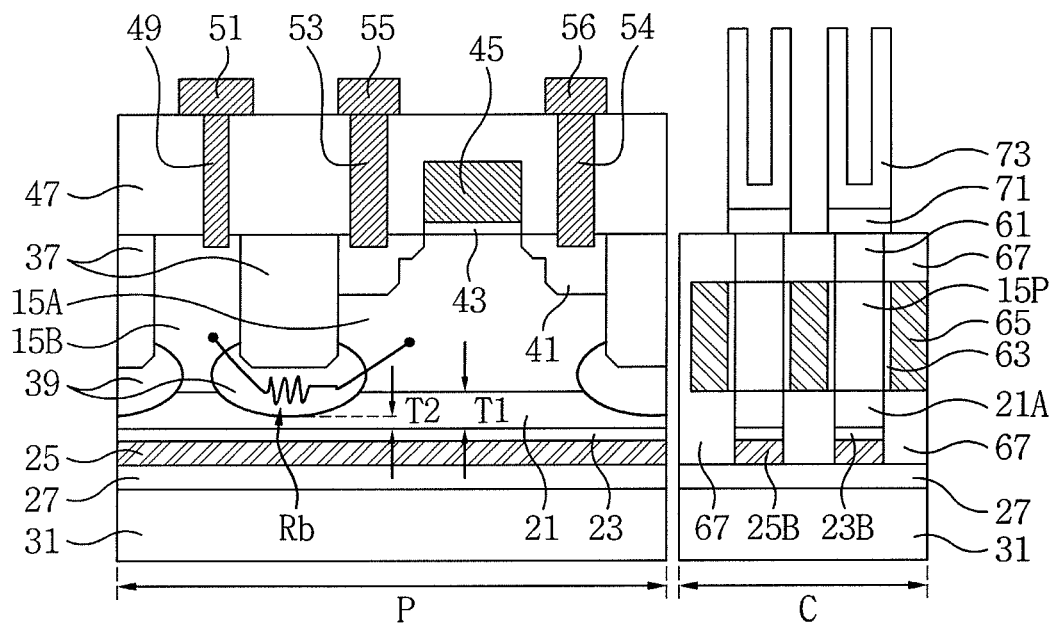
FIG. 1 is a cross-sectional view of a semiconductor device according to an exemplary embodiment of the present inventive concept.

Exemplary embodiments of the present inventive concept will be described more fully hereinafter with reference to the accompanying drawings. Like reference numerals may refer to like elements throughout the accompanying drawings.

It will be understood that when an element or layer is referred to as being "on," "connected to," "coupled to," "adjacent to," "between," or "covering" another element or layer, it can be directly on, connected to, coupled to, adjacent to, or between the other element or layer, or intervening elements or layers may be present.

It will be understood that, although the terms first, second, third, etc. may be used herein to describe various elements, components, regions, layers and/or sections, these elements, components, regions, layers and/or sections should not be limited by these terms. Thus, a first element, component, region, layer or section discussed below could be termed a second element, component, region, layer or section without departing from the spirit and scope of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures.

FIG. 1 is a cross-sectional view of a semiconductor device according to an exemplary embodiment of the present inventive concept.

Referring to FIG. 1, an adhesive layer 27 is provided on a substrate 31 having a cell region C and a peripheral region P. The adhesive layer 27 is an insulating layer such as, for example, a silicon oxide layer. The adhesive layer 27 covers one surface of the substrate 31.

The substrate 31 is a semiconductor substrate such as, for example, a single crystalline semiconductor wafer. Through electrodes and/or active/passive devices may also be provided in the substrate 31. In exemplary embodiments, the substrate 31 is one of, for example, a flexible printed circuit board (PCB), a rigid PCB, a rigid-flexible PCB, a glass plate, a metal plate, or any combination thereof, however the substrate 31 is not limited thereto.

Interconnection layers are disposed on the adhesive layer 27 in the peripheral region P. The interconnection layers may include, for example, a barrier layer 23 and a metal layer 25, however the interconnection layers are not limited thereto. A buried well 21 is provided on the interconnection layers (e.g., the barrier layer 23 and the metal layer 25). A first active region 15A and a second active region 15B are disposed on the buried well 21. An isolation layer 37 is disposed between the first active region 15A and the second active region 15B. A low resistance region 39 is provided between the isolation layer 37 and the interconnection layers (e.g., the barrier layer 23 and the metal layer 25). A gate electrode 45 is disposed on the first active region 15A. A gate dielectric layer 43 is interposed between the gate electrode 45 and the first active region 15A. Source and drain regions 41 are provided in the first active region 15A adjacent to both sides of the gate electrode 45. The gate electrode 45, the first active region 15A, the second active region 15B, the source and drain electrodes 41 and the isolation layer 37 are covered with an interlayer insulating layer 47. A back bias line 51 and interconnections 55 and 56 are disposed on the interlayer insulating layer 47. A back plug 49 is provided between the back bias line 51 and the second active region 15B. Drain plugs 53 and 54 are provided between the interconnections 55 and 56 and the source and drain regions 41.

The metal layer 25 covers the adhesive layer 27 in the peripheral region P. The barrier layer 23 covers the metal layer 25. The metal layer 25 may include, for example, one of W, WN, Ti, TiN, Ta, and TaN layers, or any combination thereof, however the metal layer 25 is not limited thereto. The barrier layer 23 may include, for example, a Ti/TiN layer, however the barrier layer 23 is not limited thereto.

The buried well 21 covers the interconnection layers (e.g., the barrier layer 23 and the metal layer 25). The buried well 21 may include, for example, impurity ions of a first conductivity type. In the exemplary embodiment described with reference to FIG. 1, the first conductivity type is an n-type, however the first conductivity type may also be a p-type. Thus, the buried well 21 shown in FIG. 1 may be referred to as a buried n-well. The buried well 21 may be, for example, a single crystalline semiconductor layer including n-type impurity ions, however the buried well 21 is not limited thereto.

The first and second active regions 15A and 15B may each be, for example, single crystalline semiconductor layers including impurity ions of a second conductivity type having a first concentration. The second conductivity type is different from the first conductivity type. For example, when the first conductivity type is an n-type, the second conductivity type is a p-type. Alternatively, when the first conductivity type is a p-type, the second conductivity type is an n-type. The second conductivity type described with reference to FIG. 1 is a p-type, however, the second conductivity type is not limited thereto. For example, referring to FIG. 1, the first conductivity type may be a p-type and the second conductive type may be an n-type. The first and second active regions 15A and 15B are disposed in an area between the buried well 21 and the isolation layer 37. The isolation layer 37 may include one of a silicon oxide layer, a silicon nitride layer, a silicon oxynitride layer, or any combination thereof, however the isolation layer 37 is not limited thereto.

The low resistance region 39 may be, for example, a single crystalline semiconductor layer including impurity ions of the second conductivity type having a second concentration, which is higher than the first concentration. For example, the low resistance region 39 may include boron (B). The low resistance region 39 makes contact with the first and second active regions 15A and 15B, as well as the isolation layer 37 and the buried well 21. The buried well 21 has a first thickness T1 substantially equal to the distance between the first active region 15A and the interconnection layers 23 and 25, and a second thickness T2 substantially equal to the distance between a lower portion of the low resistance region 39 and the interconnection layers 23 and 25. The second thickness T2 is smaller than the first thickness T1.

The gate dielectric layer 43 includes one of a silicon oxide layer, a silicon nitride layer, a silicon oxynitride layer, a high-K dielectric layer, or any combination thereof, however the gate dielectric layer 43 is not limited thereto. The gate electrode 45 crosses over the first active region 15A. The gate electrode 45 may include one of a polysilicon layer, a metal layer, a metal silicide layer, or any combination thereof, however the gate electrode 45 is not limited thereto. The source and drain regions 41 may be, for example, a single crystalline semiconductor layer including impurity ions of the first conductivity type.

The interlayer insulating layer 47 includes one of a silicon oxide layer, a silicon nitride layer, a silicon oxynitride layer, a low-K dielectric layer, or any combination thereof, however the interlayer insulating layer 47 is not limited thereto. The back plug 49 makes contact with the second active region 15B through the interlayer insulating layer 47. The back plug 49 may include one of a polysilicon layer, a metal layer, a metal silicide layer, or any combination thereof, however the back plug 49 is not limited thereto. The back bias line 51 makes contact with the back plug 49. The back bias line 51 may include one of a polysilicon layer, a metal layer, a metal silicide layer, or any combination thereof, however the back bias line 51 is not limited thereto.

The adhesive layer 27 covers the cell region C. Bit lines 23B and 25B are disposed on the adhesive layer 27 in the cell region C. First source and drain regions 21A are provided on the bit lines 23B and 25B. An active pillar 15P is disposed on the first source and drain regions 21A. Second source and drain regions 61 are disposed on the active pillar 15P. A word line 65 is provided on a sidewall of the active pillar 15P. A cell gate dielectric layer 63 is interposed between the active pillar 15P and the word line 65. Together, the word line 65, the active pillar 15P, the first source and drain regions 21A, and the second source and drain regions 61 form a cell transistor. The cell transistor and the bit lines 23B and 25B are covered with a cell insulating layer 67. A landing pad 71 connected to the second source and drain regions 61 is disposed on the cell insulating layer 67. A data storage element 73 is provided on the landing pad 71. The data storage element 73 is connected to the cell transistor via the landing pad 71. The data storage element 73 may be, for example, a storage node of a DRAM capacitor.

The bit lines 23B and 25B are formed of the same material as the interconnection layers 23 and 25, but the bit lines 23B and 25B are not limited thereto. For example, the bit line 25B may be a bit metal layer that is formed of the same material as the metal layer 25, and the bit line 23B may be a bit barrier layer that is formed of the same material as the barrier layer 23. The bit lines 23B and 25B are placed at substantially the same level and have substantially the same thickness as the interconnection layers (e.g., the barrier layer 23 and the metal layer 25, respectively). The first source and drain regions 21A are formed of the same material as the buried well 21. For example, the first source and drain regions 21A may be a single crystalline semiconductor layer including first conductivity-type impurity ions. The first source and drain regions 21A have substantially the same height as the buried well 21, and substantially the same thickness as the first thickness T1.

The active pillar 15P is formed of a material having a substantially similar composition as the first active region 15A. For example, the active pillar 15P may be a single crystalline semiconductor layer including impurity ions having the second conductivity type. The second source and drain regions 61 may be, for example, a single crystalline semiconductor layer including impurity ions of the first conductivity type. Top surfaces of the second source and drain regions 61 have substantially the same height as a top surface of the first active region 15A. Further, the top surfaces of the second source and drain regions 61 are exposed at substantially the same level as a top surface of the cell insulating layer 67.

The word line 65 covers the sidewall of the active pillar 15P. The word line 65 may include one of a polysilicon layer, a metal layer, a metal silicide layer, or any combination thereof, however the word line 65 is not limited thereto. The cell gate dielectric layer 63 may include one of a silicon oxide layer, a silicon nitride layer, a silicon oxynitride layer, a low-K dielectric layer, or any combination thereof, however the cell gate dielectric layer 63 is not limited thereto. The cell insulating layer 67 may include one of a silicon oxide layer, a silicon nitride layer, a silicon oxynitride layer, a low-K dielectric layer, or any combination thereof, however the cell insulating layer 67 is not limited thereto. The cell transistor formed by the word line 65, the active pillar 15P, the first source and drain regions 21A, and the second source and drain regions 61 may be referred to as a vertical channel cell transistor (VCCT).

Together, the gate electrode 45, the source and drain regions 41, and the first active region 15A form a peripheral transistor. The first active region 15A is electrically connected to the back bias line 51 via the low resistance region 39, the second active region 15B, and the back plug 49.

According to the exemplary embodiment described with reference to FIG. 1, the first active region 15A and the second active region 15B are p-wells, however the first active region 15A and the second active region 15B are not limited thereto. The low resistance region 39 may be a single crystalline semiconductor layer including boron (B), however the low resistance region 39 is not limited thereto. Thus, the low resistance region 39 has impurity ions of the same conductivity type as the first and second active regions 15A and 15B. Further, the low resistance region 39 has impurity ions of higher concentrations than those of the first and second active regions 15A and 15B. As a result, a back bias resistance (Rb) between the first active region 15A and the second active region 15B may be reduced by the low resistance region 39.

FIGS. 2 to 5 are cross-sectional views of a semiconductor device according to an exemplary embodiment of the present inventive concept.

Figure 2:
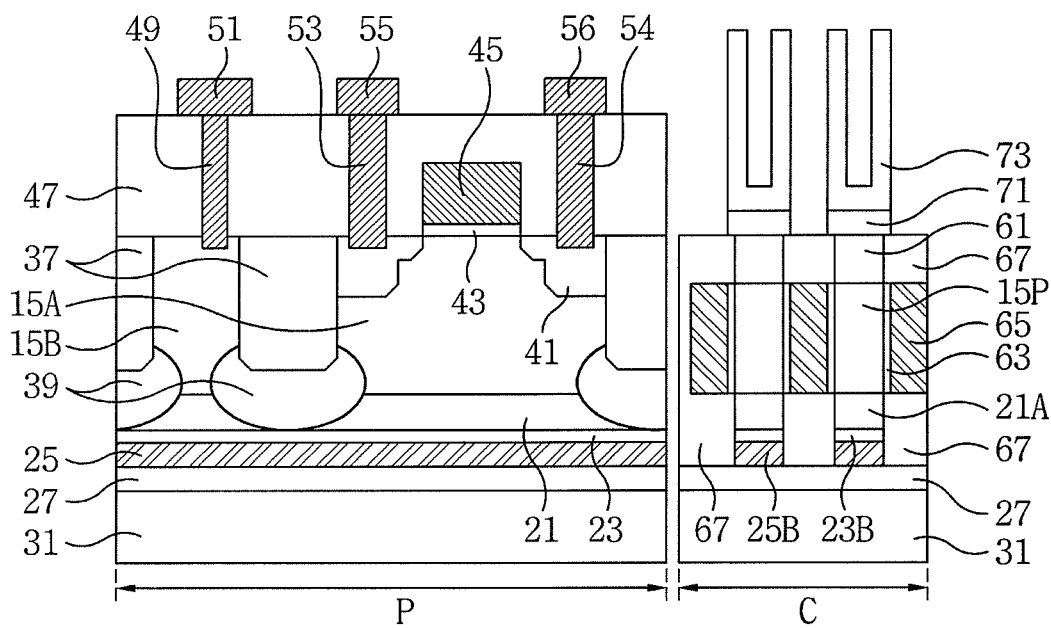
FIGS. 2 to 5 are cross-sectional views of a semiconductor device according to an exemplary embodiment of the present inventive concept.

Referring to FIG. 2, the low resistance region 39 extends through the buried well 21 to make contact with the interconnection layer (e.g., the barrier layer 23). The low resistance region 39 is formed between, and makes contact with the first and second active regions 15A and 15B. The first active region 15A is electrically connected to the back bias line 51 via the low resistance region 39, the second active region 15B, and the back plug 49.

Figure 3:
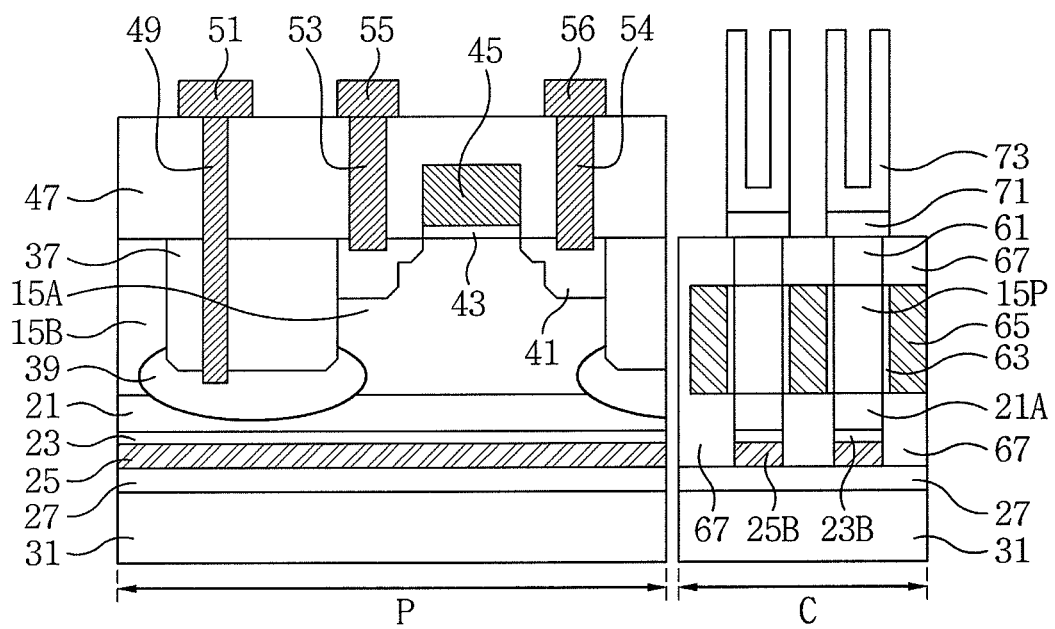

Referring to FIG. 3, the back plug 49 extends through the interlayer insulating layer 47 and the isolation layer 37 and connects to the low resistance region 39. The first active region 15A is electrically connected to the back bias line 51 via the low resistance region 39 and the back plug 49.

Figure 4:
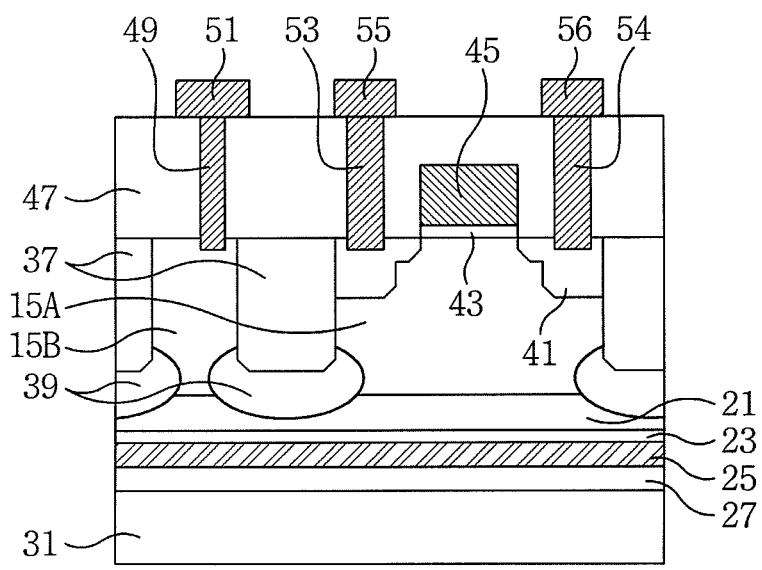

Referring to FIG. 4, the adhesive layer 27, the interconnection layers (e.g., the barrier layer 23 and the metal layer 25), the buried well 21, the first active region 15A, the second active region 15B, the isolation layer 37, the low resistance region 39, the gate dielectric layer 43, the gate electrode 45, the source and drain regions 41, the interlayer insulating layer 47, the back plug 49, the back bias line 51, the drain plugs 53 and 54, and the interconnections 55 and 56 are provided on the substrate 31, which does not include the cell region C.

Figure 5:
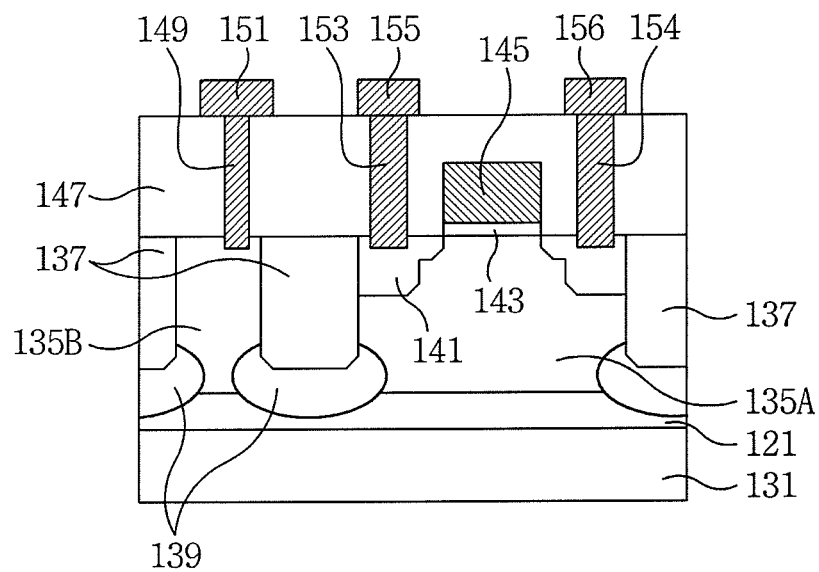

Referring to FIG. 5, a buried well 121, a first active region 135A, a second active region 135B, an isolation layer 137, a low resistance region 139, a gate dielectric layer 143, a gate electrode 145, source and drain regions 141, an interlayer insulating layer 147, a back plug 149, a back bias line 151, drain plugs 153 and 154, and interconnections 155 and 156 are provided on a semiconductor substrate 131.

The buried well 121 includes impurity ions having a different conductivity type from the semiconductor substrate 131, and makes contact with the semiconductor substrate 131. The first active region 135A is electrically connected to the back bias line 151 via the low resistance region 139, the second active region 135B, and the back plug 149.

FIGS. 6 to 15 are cross-sectional views illustrating a method of fabricating a semiconductor device according to an exemplary embodiment of the present inventive concept.

Figure 6:
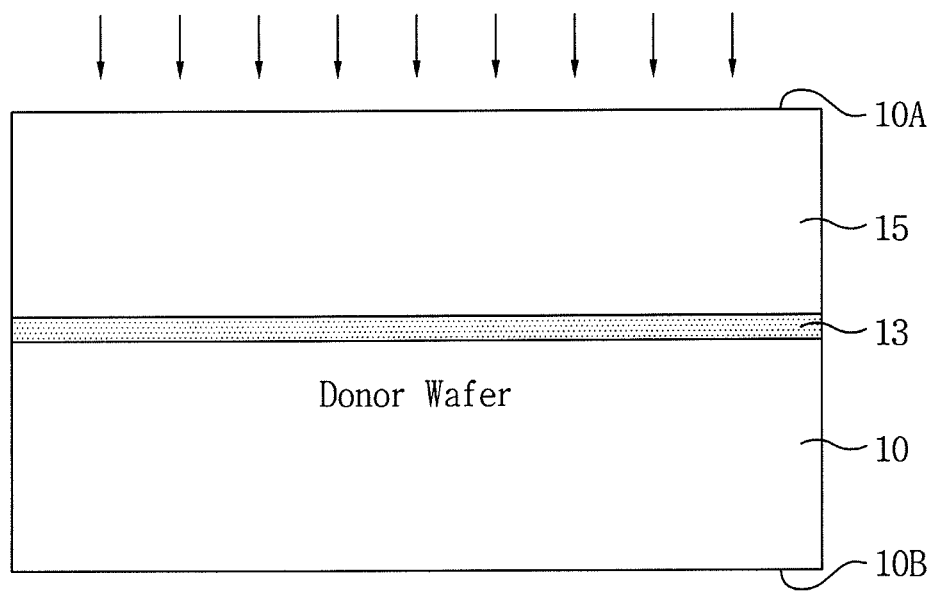
FIGS. 6 to 15 are cross-sectional views illustrating a method of fabricating a semiconductor device according to an exemplary embodiment of the present inventive concept.

Referring to FIG. 6, a hydrogen ($H^+$) ion layer 13 is formed by performing an ion implantation process on a semiconductor substrate 10 having top and bottom surfaces 10A and 10B. The portion of the semiconductor substrate 10 disposed above the hydrogen ion layer 13 may be referred to as an upper portion 15 of the semiconductor substrate 10. The upper portion 15 includes the top surface 10A. The semiconductor substrate 10 may be, for example, a single crystalline semiconductor wafer having p-type impurity ions, and the upper portion 15 may be, for example, a single crystalline semiconductor layer having p-type impurity ions. The semiconductor substrate 10 may be referred to as a donor wafer.

Figure 7:
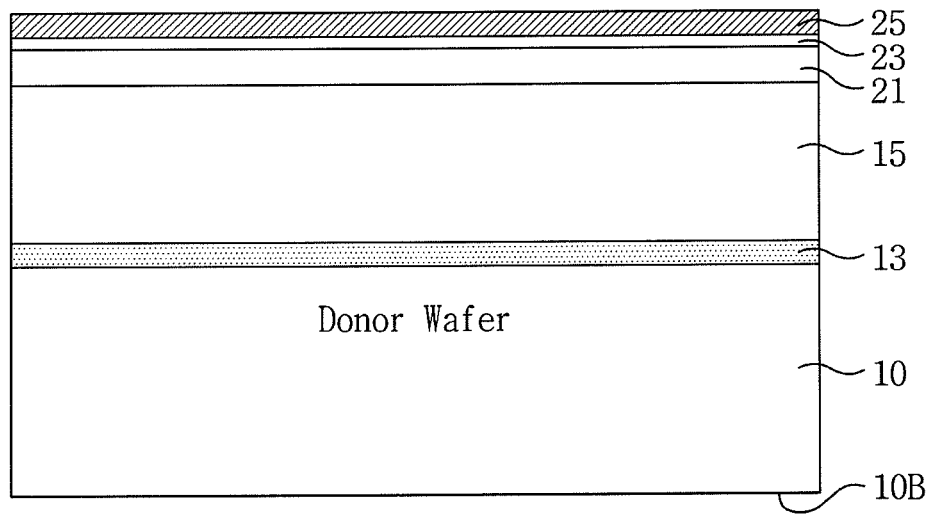

Referring to FIG. 7, a buried n-well 21 is formed by implanting n-type impurity ions into a surface of the upper portion 15 of the semiconductor substrate 10. According to an exemplary embodiment, a buried p-well may be similarly formed by implanting p-type impurity ions into the surface of the upper portion 15 of the semiconductor substrate 10. The upper portion 15 is disposed between the buried n-well 21 and the hydrogen ion layer 13. Subsequently, a barrier layer 23 and a metal layer 25 are sequentially formed on the buried n-well 21. The barrier layer 23 and the metal layer 25 may constitute the interconnection layers discussed with reference to FIGS. 1 to 4. The barrier layer 23 and the metal layer 25 cover the buried n-well 21.

Figure 8:
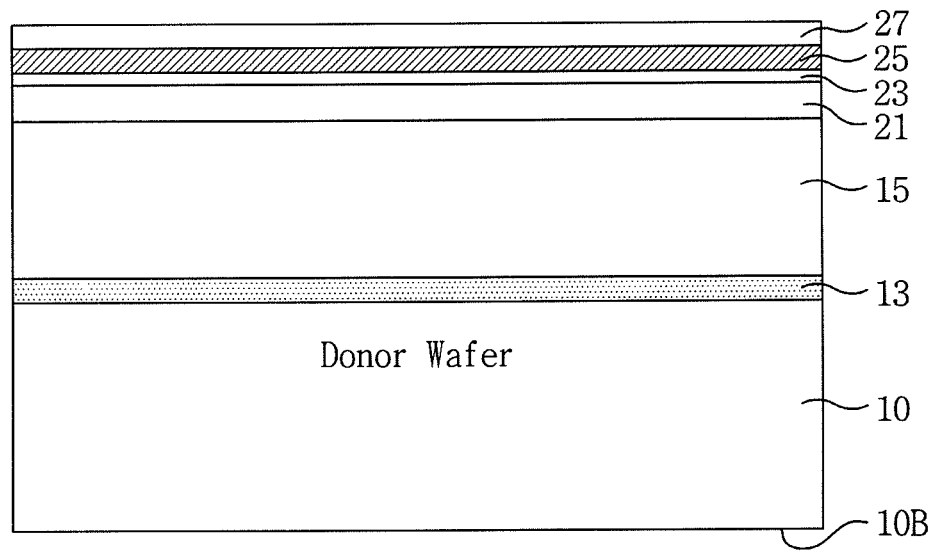

Referring to FIG. 8, an adhesive layer 27 is formed on the metal layer 25. The adhesive layer 27 may include an insulating layer such as, for example, a silicon oxide layer.

Figure 9:
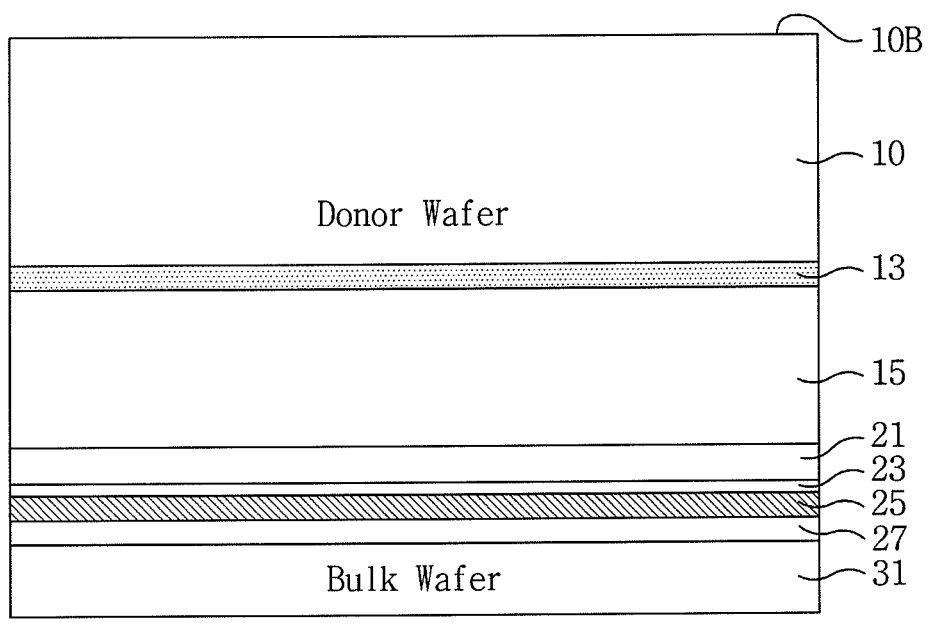

Referring to FIG. 9, the semiconductor substrate 10 may be bonded to the substrate 31 by heat and pressure. The exemplary embodiment described with reference to FIGS. 9 to 15 includes a bulk wafer as the substrate, and is referred to as the bulk substrate 31.

The bottom surface 10B of the semiconductor substrate 10 is exposed, and the adhesive layer 27 is interposed between the bulk substrate 31 and the metal layer 25. As shown in FIG. 9, a structure formed by sequentially stacking the adhesive layer 27, the metal layer 25, the barrier layer 23, the buried n-well 21, the upper portion 15 of the semiconductor substrate 10, the hydrogen ion layer 13, and the semiconductor substrate 10 is provided on the bulk substrate 31.

Figure 10:
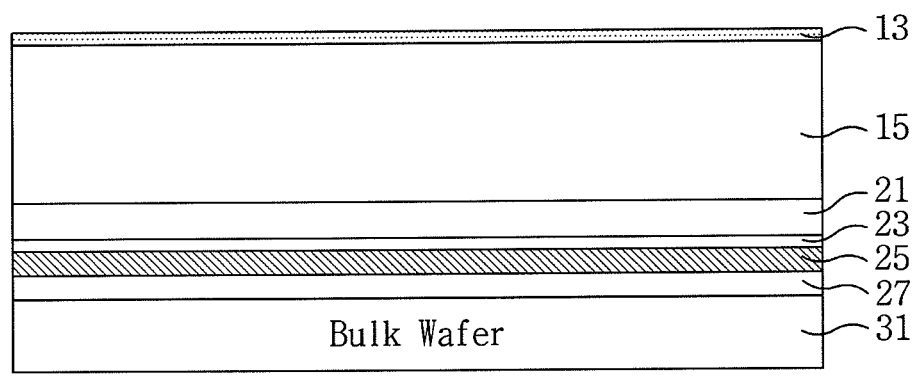

Referring to FIG. 10, the semiconductor substrate 10, excluding the upper portion 15, is removed using, for example, a cleaving process. As a result, a structure formed by sequentially stacking the adhesive layer 27, the metal layer 25, the barrier layer 23, the buried n-well 21, the upper portion 15 of the semiconductor substrate 10, and the hydrogen ion layer 13 is formed on the bulk substrate 31. In an exemplary embodiment, the hydrogen ion layer 13 is partially removed, thus reducing the thickness of the structure.

Figure 11:
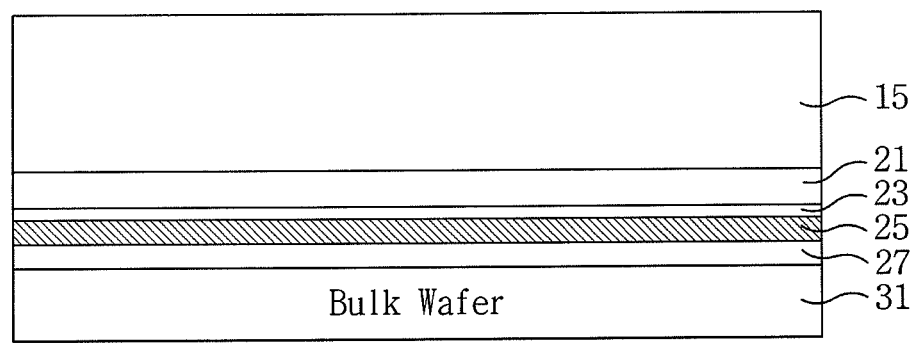

Referring to FIG. 11, the upper portion 15 of the semiconductor substrate 10 is exposed by removing the hydrogen ion layer 13. The hydrogen ion layer 13 may be removed using, for example, chemical mechanical polishing (CMP).

Figure 12:
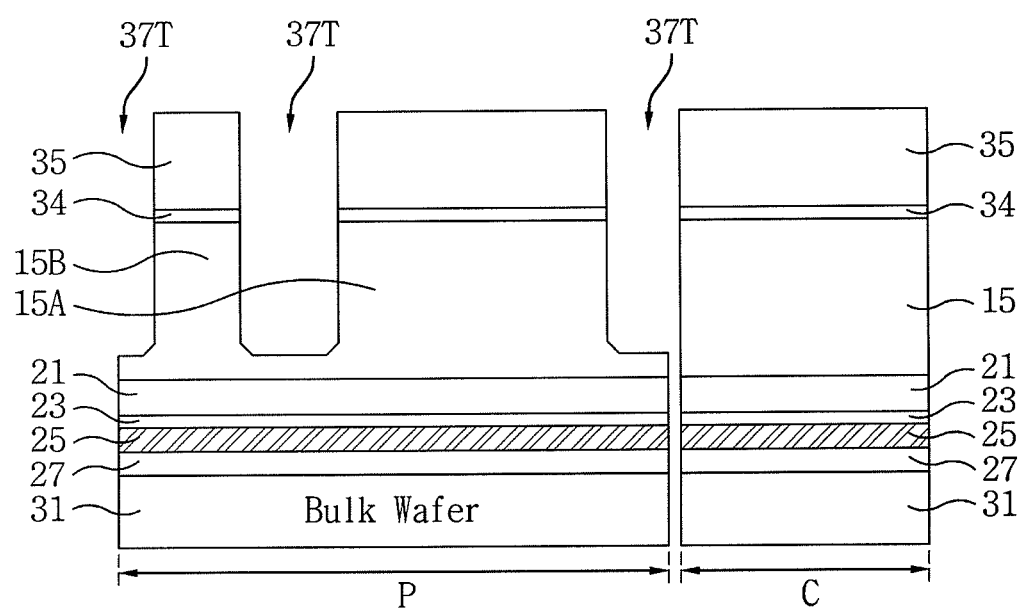

Referring to FIG. 12, mask patterns 34 and 35 are formed on the upper portion 15 of the semiconductor substrate 10. The upper portion 15 is partially removed using the mask patterns 34 and 35 as etch masks, thereby forming an isolation trench 37T defining first and second active regions 15A and 15B. The bulk substrate 31 includes a cell region C and a peripheral region P. The first active region 15A, the second active region 15B, and the isolation trench 37T are formed in the peripheral region P. The first and second active regions 15A and 15B may be, for example, single crystalline semiconductor layers having p-type impurity ions. According to an exemplary embodiment, when a buried p-wall is formed, the first and second active regions 15A and 15B may be single crystalline semiconductor layers having n-type impurity ions. The upper portion 15 of the semiconductor substrate 10 is disposed in the cell region C.

The mask patterns 34 and 35 are formed by sequentially stacking a buffer layer (e.g., mask pattern 34) and a mask layer (e.g., mask pattern 35), however formation of the mask patterns 34 and 35 is not limited thereto. For example, the buffer layer (e.g., mask pattern 34) may include a silicon oxide layer, and the mask layer (e.g., mask pattern 35) may include a silicon nitride layer.

Figure 13:
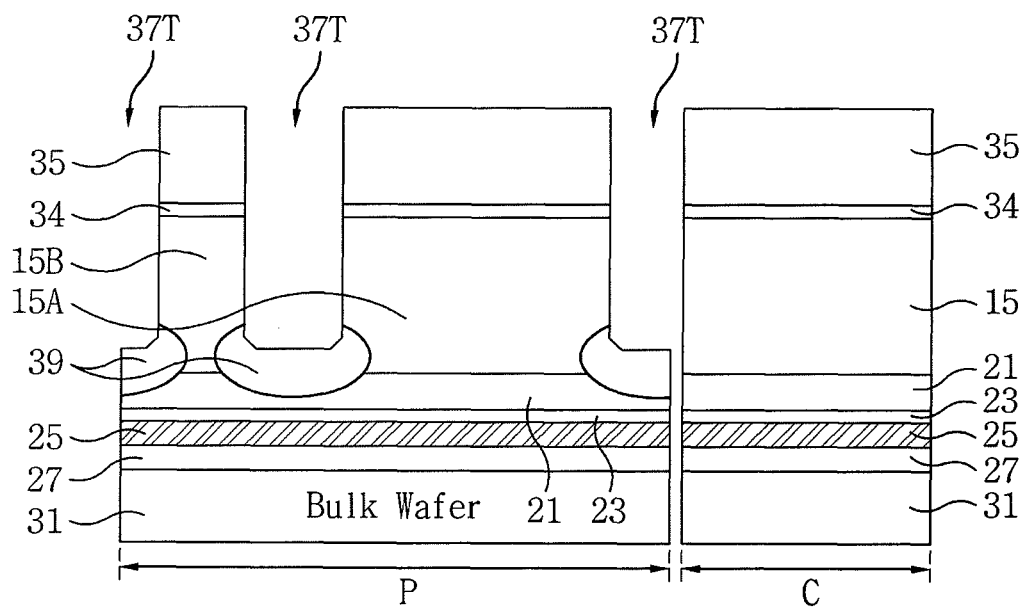

Referring to FIG. 13, a low resistance region 39 is formed under the isolation trench 37T using the mask patterns 34 and 35 as ion implantation masks. The low resistance region 39 is formed by implanting impurity ions having the same conductivity type as the first and second active regions 15A and 15B. For example, when the first and second active regions 15A and 15B include p-type impurity ions, the low resistance region 39 includes p-type impurity ions of higher concentrations than those of the first and second active regions 15A and 15B. According to exemplary embodiments, the low resistance region 39 may have various depths and widths.

Figure 14:
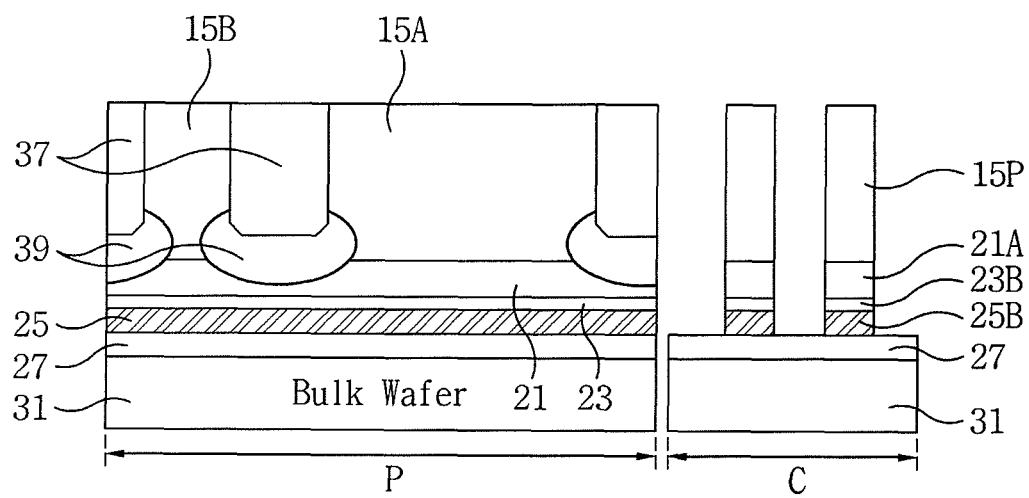

Referring to FIG. 14, an isolation layer 37 filling the isolation trench 37T is formed, and the mask patterns 34 and 35 are removed.

Further, bit lines 23B and 25B, first source and drain regions 21A, and an active pillar 15P are formed on the adhesive layer 27 in the cell region C by sequentially patterning the upper portion 15 of the semiconductor substrate 10, the buried n-well 21, the barrier layer 23, and the metal layer 25. A top surface of the active pillar 15P has substantially the same height as those of the first and second active regions 15A and 15B.

Figure 15:
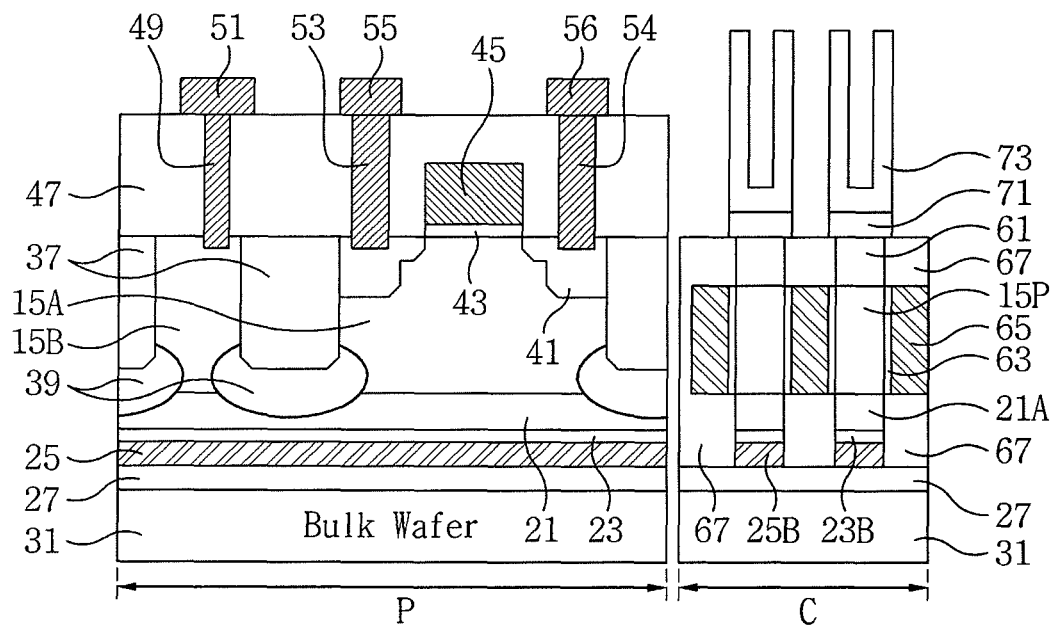

Referring to FIG. 15, a gate dielectric layer 43 and a gate electrode 45 are formed on the first active region 15A. Source and drain regions 41 are formed in the first active region 15A adjacent to both sides of the gate electrode 45. An interlayer insulating layer 47 covering the peripheral region P is also formed. A back plug 49 and drain plugs 53 and 54 passing through the interlayer insulating layer 47 are also formed. A back bias line 51 is formed on the interlayer insulating layer 47 and makes contact with the back plug 49, and interconnections 55 and 56 are formed on the interlayer insulating layer 47 and make contact with the drain plugs 53 and 54.

Further, a cell gate dielectric layer 63 and a word line 65 partially covering a sidewall of the active pillar 15P are sequentially formed. Second source and drain regions 61 are formed by implanting impurity ions of the same conductivity type as the first source and drain regions 21A into an upper region of the active pillar 15P. The active pillar 15P is disposed between the first source and drain regions 21A and the second source and drain regions 61. A cell insulating layer 67 is formed on the adhesive layer 27 in the cell region C. A landing pad 71 connected to the second source and drain regions 61 is formed on the cell insulating layer 67. A data storage element 73 is formed on the landing pad 71. The data storage element 73 may be, for example, a storage node of a DRAM capacitor.

Figure 16:
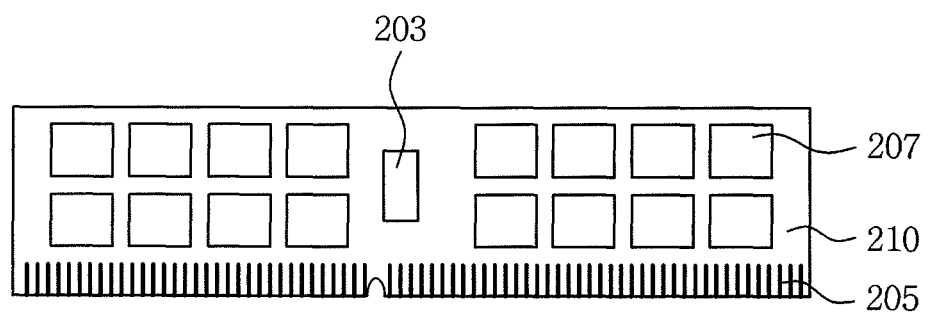
FIG. 16 is a plan view of a semiconductor module according to an exemplary embodiment of the present inventive concept.

FIG. 16 is a plan view of a semiconductor module according to an exemplary embodiment of the present inventive concept.

Referring to FIG. 16, the semiconductor module according to an exemplary embodiment includes a module substrate 210, a plurality of semiconductor packages 207, and a control chip package 203. Input and output terminals 205 are formed in the module substrate 210. At least one of the semiconductor packages 207 and the control chip package 203 have a similar configuration as those described with reference to FIGS. 1 to 15. For example, referring to FIGS. 1 and 16, the low resistance region 39 may be formed in the semiconductor packages 207 and/or the control chip package 203, and the back bias line 51 may be electrically connected to the input and output terminals 205 via a bond finger (not shown) formed in the module substrate 210.

The semiconductor packages 207 and the control chip package 203 are mounted on the module substrate 210. The semiconductor packages 207 and the control chip package 203 may be electrically connected to the input and output terminals 205 in series or parallel.

According to an exemplary embodiment, the control chip package 203 may be omitted. Further, the semiconductor packages 207 may include volatile memory chips such as, for example, DRAMs and static random access memories (SRAMs), non-volatile memory chips such as, for example, flash memories, phase change memories, magnetic random access memories (MRAMs), and resistive random access memories (RRAMs), or any combination thereof, however the semiconductor packages 207 are not limited thereto. The semiconductor module according to the exemplary embodiment shown in FIG. 16 may be, for example, a memory module.

Figure 17:
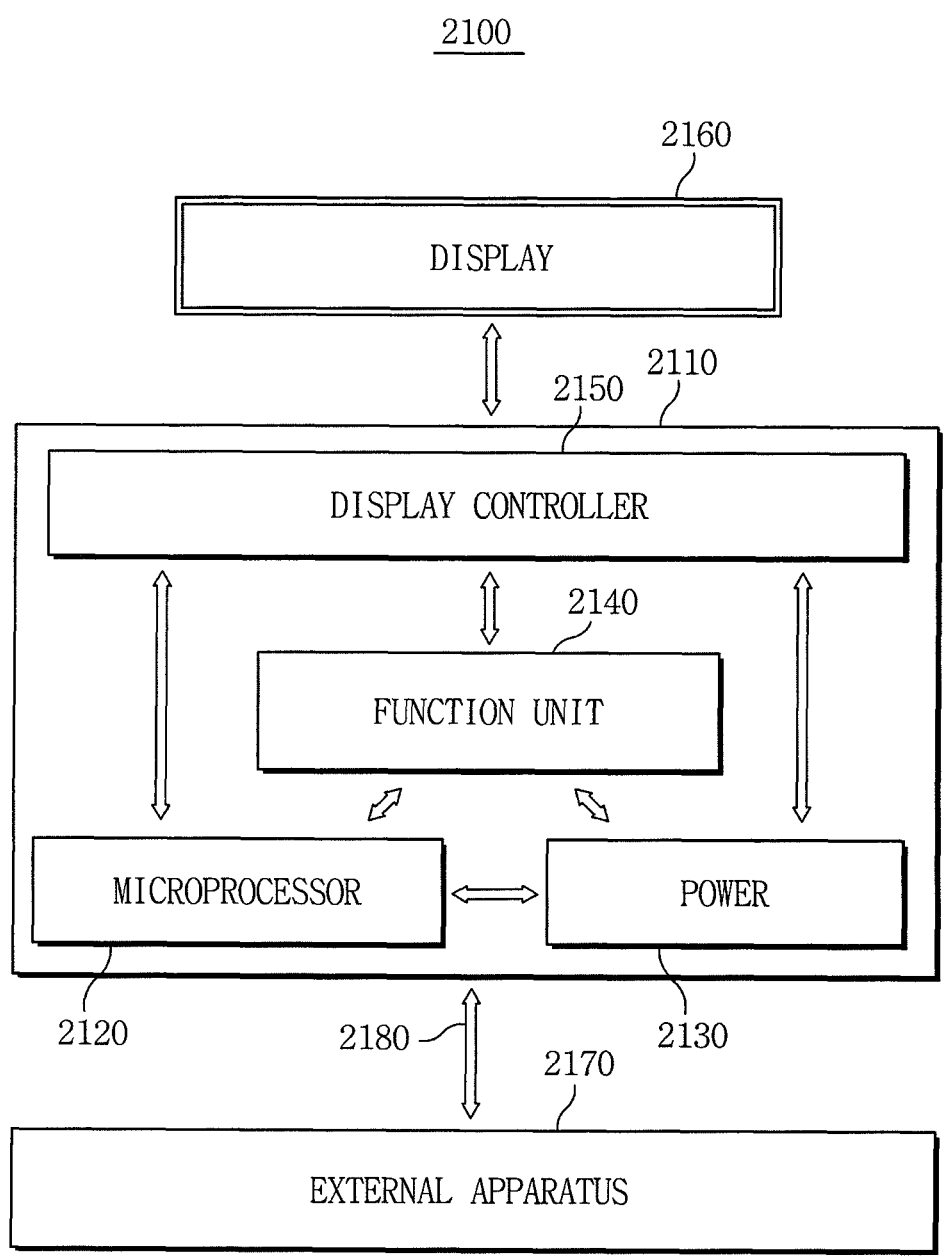
FIG. 17 is a block diagram of an electronic device according to an exemplary embodiment of the present inventive concept.

FIG. 17 is a system block diagram of an electronic device according to an exemplary embodiment of the present inventive concept.

Referring to FIG. 17, a semiconductor device similar to those described with reference to FIGS. 1 to 15 may be included in an electronic system 2100. The electronic system 2100 may include a body 2110, a microprocessor unit 2120, a power unit 2130, a function unit 2140, and a display controller unit 2150. The body 2110 may be, for example, a motherboard formed of a PCB. The microprocessor unit 2120, the power unit 2130, the function unit 2140, and the display controller unit 2150 are mounted on the body 2110. A display unit 2160 may be disposed inside or outside of the body 2110. For example, the display unit 2160 may be disposed on a surface of the body 2110 and may display an image processed by the display controller unit 2150.

The power unit 2130 receives a predetermined voltage from an external battery (not shown), divides the voltage into predetermined voltage levels, and supplies the divided voltages to the microprocessor unit 2120, the function unit 2140, and the display controller unit 2150. The microprocessor unit 2120 receives a voltage from the power unit 2130 and controls the function unit 2140 and the display unit 2160. The function unit 2140 may perform various functions of the electronic system 2100. For example, when the electronic system 2100 is a mobile phone, the function unit 2140 may include several components capable of performing functions of the mobile phone such as, for example, image output to the display unit 2160 and voice output to a speaker in response to dialing or communication with an external apparatus 2170. When the electronic system 2100 is a camera-installed mobile phone, the function unit 2140 may serve as a camera image processor.

In some exemplary embodiments, when the electronic system 2100 is connected to a memory card for capacity extension, the function unit 2140 is a memory card controller. The function unit 2140 may send and/or receive signals to or from the external apparatus 2170 through a wired or wireless communication path 2180. Further, when the electronic system 2100 includes a universal serial bus (USB) connection for function extension, the function unit 2140 may function as an interface controller.

A semiconductor device similar to those described with reference to FIGS. 1 to 15 may be utilized for at least one of the microprocessor unit 2120 and the function unit 2140. For example, referring to FIGS. 1 and 17, the low resistance region 39 may be formed in the microprocessor unit 2120 and/or the function unit 2140, and the back bias line 51 may be electrically connected to the bond finger (not shown) formed in the body 2110.

An isolation layer defining an active region and a low resistance region formed under the isolation layer may be further provided. The low resistance region may include impurity ions having the same conductivity type as the active region. The active region may be electrically connected to a back bias line via the low resistance region. The low resistance region may be utilized to deliver a back bias to the active region.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A semiconductor device, comprising:
   a buried well having impurity ions of a first conductivity type, wherein the buried well is disposed on a substrate;
   a first active region and a second active region each having impurity ions of a second conductivity type, wherein the second conductivity type is different from the first conductivity type, and the first and second active regions are disposed on the buried well;
   an isolation layer disposed between and contacting the first and second active regions; and
   a low resistance region disposed between the isolation layer and the substrate and contacting the first and second active regions and the buried well, wherein the low resistance region has impurity ions of the second conductivity type, and a concentration of the impurity ions in the low resistance region is greater than a concentration of the impurity ions in each of the first and second active regions,
   wherein the first and second active regions are separated from each other by the isolation layer and the low resistance region.

2. The device of claim 1, further comprising:
   an adhesive layer disposed between the substrate and the buried well; and an interconnection layer disposed between the adhesive layer and the buried well, wherein the low resistance region extends into the buried well.

3. The device of claim 1, wherein the buried well has a first thickness substantially equal to a distance between the first active region and the interconnection layer, and a second thickness substantially equal to a distance between a lower portion of the low resistance region and the interconnection layer, wherein the second thickness is less than the first thickness.

4. The device of claim 1, wherein the low resistance region makes direct contact with the isolation layer.

5. The device of claim 2, wherein the interconnection layer comprises:
a barrier layer; and
a metal layer disposed between the barrier layer and the adhesive layer.

6. The device of claim 1, further comprising:
a back bias line electrically connected to the low resistance region.

7. The device of claim 6, further comprising:
a gate electrode disposed on the first active region;
a source region and a drain region disposed in the first active region, wherein the source region is adjacent to a first side of the gate electrode and the drain region is adjacent to a second side of the gate electrode; and
a back plug connected to the back bias line.

8. The device of claim 7, wherein the back plug makes contact with the second active region.

9. The device of claim 7, wherein the back plug extends through the isolation layer and is connected to the low resistance region.

10. The device of claim 1, further comprising:
an adhesive layer disposed between the substrate and the buried well; and
an interconnection layer disposed between the adhesive layer and the buried well, wherein the low resistance region extends through the buried well and makes contact with the interconnection layer.

11. A semiconductor device, comprising:
a buried n-well disposed on a substrate having a peripheral region and a cell region;
a first active region and a second active region each having p-type impurity ions, wherein the first and second active regions are disposed on the buried n-well;
an isolation layer disposed between and contacting the first and second active regions; and
a low resistance region disposed between the isolation layer and the substrate and contacting the first and second active regions and the buried n-well, wherein the low resistance region has p-type impurity ions, and a concentration of the p-type impurity ions in the low resistance region is greater than a concentration of the p-type impurity ions in each of the first and second active regions,
wherein the first and second active regions are separated from each other by the isolation layer and the low resistance region.

12. The device of claim 11, further comprising:
an adhesive layer disposed on the substrate in each of the peripheral region and the cell region; and
an interconnection layer disposed on the adhesive layer in the peripheral region.

13. The device of claim 12, further comprising:
a cell transistor formed in the cell region of the substrate; and
a bit line disposed between the cell transistor and the adhesive layer.

14. The device of claim 13, wherein the bit line is a same material as the interconnection layer, and the bit line is disposed at substantially a same level as the interconnection layer.

15. The device of claim 13, wherein the cell transistor comprises:
a first source region and a first drain region disposed on the bit line;
an active pillar disposed on the first source region and the first drain region;
a second source region and a second drain region disposed on the active pillar; and
a word line formed on a sidewall of the active pillar.

16. The device of claim 15, wherein the first source and drain regions are a same material as the buried n-well, the first source and drain regions have substantially a same height as the buried n-well, and a top surface of the second source and drain regions has substantially a same height as a top surface of the first active region.

17. The device of claim 15, further comprising:
a data storage element connected to the second source and drain regions.

18. The device of claim 11, wherein the first active region, the second active region, and the low resistance region are each a single crystalline semiconductor layer formed of boron (B).

19. The device of claim 11, wherein the buried n-well is a single continuous layer, and the first and second active regions are disposed on the single continuous layer.

20. The device of claim 11, wherein the low resistance region makes direct contact with the isolation layer.

21. The device of claim 11, wherein the low resistance region extends through the buried well.

22. The device of claim 1, wherein the low resistance region extends through the buried well.

* * * * *